United States Patent [19]
Fagard et al.

[11] Patent Number: 5,327,164
[45] Date of Patent: Jul. 5, 1994

[54] METHOD AND APPARATUS FOR PROVIDING A TOUCH SCREEN

[75] Inventors: Pierre Fagard, Montigny le Bretonneux; Claude Nigen, Le Chesnay; Jean-Marc Coppin, Villeneuve Saint Georges; Xavier Caugant, Versailles, all of France

[73] Assignee: Sextant Avionique, Meudon la Foret, France

[21] Appl. No.: 31,635

[22] Filed: Mar. 12, 1993

[30] Foreign Application Priority Data

Mar. 17, 1992 [FR] France .................. 92 03165

[51] Int. Cl.⁵ .............................................. G09G 3/02
[52] U.S. Cl. ...................................... 345/174; 341/33
[58] Field of Search ............... 340/712, 707, 708, 706, 340/709, 718, 784.1; 178/18, 19; 341/33, 34, 22; 361/398, 174, 254, 268; 200/512, 518; 177/229; 439/65, 67; 345/173, 174, 156, 179, 182, 184, 178, 341, 361, 200, 177, 439

[56] References Cited

U.S. PATENT DOCUMENTS

| | | | |
|---|---|---|---|
| 4,121,049 | 10/1978 | Roeber | 178/18 |
| 4,304,976 | 12/1981 | Gottbreht et al. | 341/33 |
| 5,038,142 | 8/1991 | Flowers et al. | 341/34 |
| 5,231,381 | 7/1993 | Duwaer | 340/712 |
| 5,241,308 | 8/1993 | Young | 341/34 |

*Primary Examiner*—Alvin E. Oberley
*Assistant Examiner*—Regina Liang
*Attorney, Agent, or Firm*—Hecker & Harriman

[57] ABSTRACT

A process and device for providing and fixing a captor of activation detection. The present invention discloses a tactile designation device for continuous capacitance detection comprising a glass plate covered by a metallic deposit on its entire surface and supported by flexible strips, means of supply of the metallized surface, and strain gauges mounted on top of the strips in order to measure their flexing. According to the present invention, the strips support the plate from a printed circuit of assembly. Each strip comprises at least one conducting part in contact, at one of its ends, with a supply track formed by the printed circuit, and at its other end, with the attachment devices of the plate on the strip that is electrically conducting and in contact with the metallized surface.

13 Claims, 1 Drawing Sheet

METHOD AND APPARATUS FOR PROVIDING A TOUCH SCREEN

BACKGROUND OF THE INVENTION

1. Field of the Invention

The present invention involves a tactile designation device for capacitance detection, and particularly, a device comprising a glass plate covered by a metallic deposit on at least one part of its surface and supported by flexible strips, means of supply for the metallic surface, and strain gauges that are set on the strips in order to measure flexing of the strips.

2. Background Art

In prior art devices, a conducting metallic deposit is covered by an insulating material on its useful surface which is carried out by processing in thin layers with the deposit of a non-reflecting multicoated layer on the metallic layer, or by means of adhesion of a thin glass with non-reflective processing.

These devices are designed to form transparent tactile keyboards provided with integrated pressure detection means. For example, such a system is set up in front of a liquid crystal display, and allows a particular displayed zone to be designated by tactile means (for example, with a finger).

For this purpose, electric means determine the position of a finger on the metallized plate and detects, due to the strain gauges, a deflection of the plate due to pressure exerted by the finger. These devices thereby provide a touch screen without significantly altering the viewing of images presented on the display and do so at a competitive cost.

The tactile designation devices presently known, however, exhibit a number of disadvantages. A disadvantage of prior art devices is that they require a supporting mechanism for maintaining and guiding the glass plate, as well as mechanical adjustments of the plate's position on each strip in order to be able to compensate for positioning allowance.

Another disadvantage is that the connection links of the metallized surface of the plate as well as the strain gauges must follow the movements of the plate.

SUMMARY OF THE INVENTION

A process and device for providing and fixing a captor of activation detection. The present invention discloses a tactile designation device for continuous capacitance detection comprising a glass plate covered by a metallic deposit on its entire surface and supported by flexible strips, means of supply of the metallized surface, and strain gauges mounted on top of the strips in order to measure their flexing.

According to the present invention, the strips support the plate from a printed circuit of assembly. Each strip comprises at least one conducting part in contact, at one of its ends, with a supply track formed by the printed circuit, and at its other end, with the attachment devices of the plate on the strip that is electrically conducting and in contact with the metallized surface.

BRIEF DESCRIPTION OF THE DRAWINGS

We will now describe by way of non-restrictive example, a design unique to the invention with reference to the appended figures, in which.

DETAILED DESCRIPTION OF THE INVENTION

Figure 1:
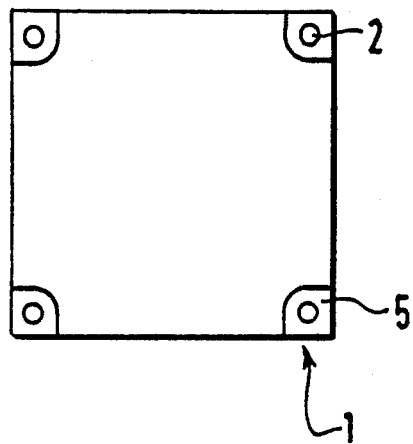
FIG. 1 is a top view diagram of a metallized plate utilized in the invented device.
Figure 2:
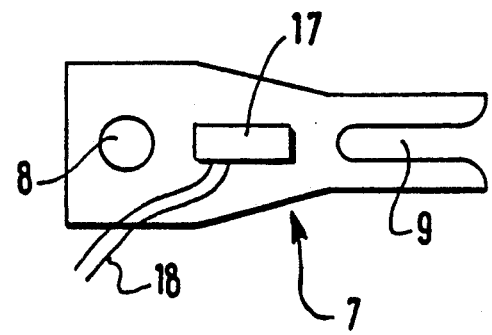
FIG. 2 is a top view diagram of a flexible, support strip.
Figure 3:
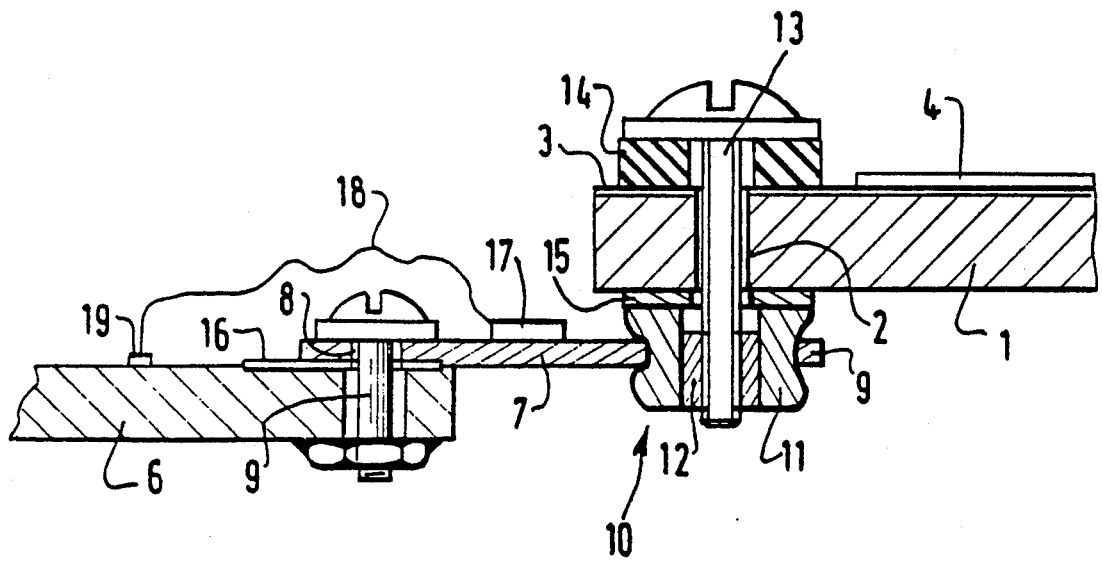
FIG. 3 is a cross section of one of the connecting devices of the glass plate to its printed circuit of support.

The present invention is designed to reduce these inconveniences by providing a tactile designation device whose mechanical management is especially simple, and that can thus be obtained at a low cost.

For this purpose, the present invention describes a tactile designation device of continuous capacitance detection comprising a glass plate covered with a metallic deposit on virtually its entire surface, and supported by flexible strips, means of supply for the metallized surface, and strain gauges set up on the strips in order to measure their flexing. The device is characterized by the fact that the strips support the plate from a printed circuit of assembly. Each strip includes at least one conducting part in contact at one of its end with a supply track of the printed circuit, and at its other end with the affixing parts of the plate on the strip that is electrically conductive and in contact with the metallized surface.

According to the present invention, the strips have a fork-shaped form at their ends of fixation to the plate. The fixation devices comprise a nut having an exterior form in the shape of a diabolo having a tightened part that is bound to the fork. Such an arrangement permits easy position adjustment of the glass plate with regards to the supporting printed circuit as well as an assembly without access to the back.

Preferably, the strips have a triangular shape at their flexing parts. Such a shape permits an isoflexion, that is to say, identical in every respect to the strip that provides for greater sensitivity of the gauges attached to the strips.

In the preferred embodiment, there are four strips and four identical gauges that reduce costs. Two strips are set in a manner so that their gauges work in compression (gauges toward the user), while the other two strips are mounted inversely (on the opposite side of the user) so that their gauges work in tension. Thus, the gauges can be arranged in a Wheatstone bridge and obtain maximum sensitivity. In this advantageous manner, the strain gauges are also connected to the printed circuits.

The device described by the present invention is thus uniquely compact since the printed circuit supporting the glass plate can also carry the signal processing electronics related to finger movement on the plate, as well as the processing electronics for signals originating from the strain gauges. Moreover, contact to the metallized surface is made directly by means of support strips and the fixing parts of the plate on the strips from the supporting printed circuit, thereby removing the connection cables of the prior art.

The glass plate 1 utilized here is essentially square having holes 2 at its four corners, thereby allowing its attachment. The plate 1 is covered entirely with a metallic deposit layer 3 and a layer 4 of dielectric insulation made non-reflective. Processing devices 5 are arranged at the four corners of plate 1 in the areas of holes 2 in order to insure electrical contact with metallized layer 3 in these areas.

The glass plate 1 is mounted on a supporting printed circuit 6 by means of flexible, metallized strips 7. The printed circuit 6 also carries the electronics necessary for the electrical supply and for the processing of signals originating from the device. These circuits may be of any known type and have not been represented in the designs.

The strips 7 have a triangular shape at their flexing part where the strain gauge is attached. Each flexible strip 7 has at one of its ends a hole 8 allowing the passage of a screw 9 for the attachment of the strip to printed circuit 6. At its other end, strip 7 has the shape of a stirrup delimiting a groove 9, thereby allowing the adjustment of fixation devices of plate 1 without requiring rear access to the device.

These fixation devices include a nut 10 having an external part 11 in the shape of a diabolo, and are made of a conducting material and a metallic insertion 12 internally threaded in order to receive a fixating screw 13. The head of screw 13 rests on metallized surface 3 by means of a soft disc 14 made of conducting elastomer.

Lastly, one or more adjustment discs 15 permit convenient height positioning of glass plate 1 with regards to printed circuit 6. The diabolo 11 that is set in groove 9 allows the positioning of glass plate 1 in the plane parallel to printed circuit 6.

The flexible strip 7 thus allows the supply the conducting layer 3 deposited on the plate 1 (from a supply track 16) formed on the surface of printed circuit 6 and having an end that is in contact with the corresponding end of strip 7. Moreover, a strain gauge 17 is attached to the surface of strip 7 in order to measure its flexing.

The supply cables 18 of gauge 17 are connected to another track 19 formed on the surface of printed circuit 6. Consequently, the present invention provides a very simple contact for the metallic layer 3 directly from supporting printed circuit 6 of the plate 1 without any connecting cable. The gauges 17 are also provided from printed circuit 6 by means of cables having minimal length.

The strips 7 also simultaneously ensure a role of maintenance and guiding the plate that has a position with regards to printed circuit 6 that can be easily adjusted.

Finally, the device described by the invention is uniquely compact, the electronics tied to metallized plate 1 and to strain gauges 17 are able to be directly arranged on printed circuit 6.

We claim:

1. A tactile designation device for continuous capacitance detection comprising a glass plate covered with a metallic deposit on its entire surface, said tactile designation device is supported by flexible strips, by means of supply to said metallic surface and by strain gauges set up on said strips in order to measure flexing of said strips, said tactile designation device characterized by the fact that said strips support said plate from a printed circuit of assembly, each of said strips carrying at least one conducting part, each of said strips having a first end that is in contact with a supply track formed on said printed circuit, each of said strips having a second end that is in contact with attachment devices of said plate on said strip that is electronically conducting and in contact with said metallized surface.

2. The device according to claim 1 wherein said strips have a fork shape at their ends of attachment to said plate, said attachment devices comprising a nut having an exterior shape of a diabolo whose tightened part is fitted into said fork.

3. The device according to any of the claims 1 and 2 wherein said strips have a triangular shape at their flexing points.

4. The device according to any one of the claims 1-2 comprising four flexible strips and four strain gauges, said four flexible strips being arranged in a manner so that two gauges work by compression and two gauges work by traction.

5. The device according to claim 4 wherein said strain gauges are assembled in a Wheatstone bridge.

6. The device according to claim 5 wherein said strain gauges are connected to said printed circuit.

7. The device according to claim 3 comprising four flexible strips and four strain gauges, said four flexible strips being arranged in a manner so that two gauges work by compression and two gauges work by traction.

8. The device according to claim 7 wherein said strain gauges are assembled in a Wheatstone bridge.

9. The device according to any of the claims 1-2 wherein said strain gauges are connected to said printed circuit.

10. The device according to claim 3 wherein said strain gauges are connected to said printed circuit.

11. The device according to claim 4 wherein said strain gauges are connected to said printed circuit.

12. The device according to claim 7 wherein said strain gauges are connected to said printed circuit.

13. The device according to claim 8 wherein said strain gauges are connected to said printed circuit.

* * * * *